United States Patent
Saponas et al.

(10) Patent No.: US 7,870,445 B2
(45) Date of Patent: Jan. 11, 2011

(54) SYSTEM AND METHOD FOR MEASURING AND DEPICTING PERFORMANCE OF A SERIAL COMMUNICATIONS LINK

(75) Inventors: Robert Saponas, Colorado Springs, CO (US); Richard A. Nygaard, Jr., Colorado Springs, CO (US)

(73) Assignee: Agilent Technologies, Inc., Santa Clara, CA (US)

(*) Notice: Subject to any disclaimer, the term of this patent is extended or adjusted under 35 U.S.C. 154(b) by 419 days.

(21) Appl. No.: 11/962,607

(22) Filed: Dec. 21, 2007

(65) Prior Publication Data

US 2009/0164854 A1 Jun. 25, 2009

(51) Int. Cl.
*G06F 11/08* (2006.01)
*G06F 11/24* (2006.01)

(52) U.S. Cl. ...................... 714/704; 714/712
(58) Field of Classification Search .................. None
See application file for complete search history.

(56) References Cited

U.S. PATENT DOCUMENTS

| | | | |
|---|---|---|---|
| 5,896,391 A * | 4/1999 | Solheim et al. ............. 714/704 |
| 6,816,987 B1 * | 11/2004 | Olson et al. .................. 714/704 |
| 7,155,228 B2 * | 12/2006 | Rappaport et al. ........... 455/446 |
| 7,650,555 B2 * | 1/2010 | Imming et al. .............. 714/738 |
| 2005/0250543 A1 * | 11/2005 | Thermond ............... 455/562.1 |
| 2006/0245528 A1 * | 11/2006 | Nygaard, Jr. ................ 375/355 |
| 2009/0052515 A1 * | 2/2009 | Webb et al. .................. 375/232 |

* cited by examiner

*Primary Examiner*—Jeffrey A Gaffin
*Assistant Examiner*—Dipakkumar Gandhi

(57) ABSTRACT

A system for measuring performance of a serial communications link includes a system under test including at least one transmitter and at least one receiver coupled together via a serial data communications link, wherein at least one of the transmitter and the receiver has at least one tunable parameter, at least one controller coupled to at least one of a transmitter and a receiver via a joint test action group JTAG interface, and logic configured to perform a bit error ratio test (BERT) at a plurality of receiver phase locations over a defined time period and concluding the BERT for a particular phase location if a BERT error count is greater than 0 at the particular phase location.

20 Claims, 15 Drawing Sheets

US 7,870,445 B2

SYSTEM AND METHOD FOR MEASURING AND DEPICTING PERFORMANCE OF A SERIAL COMMUNICATIONS LINK

BACKGROUND

A typical high speed serial data communications link operates by combining a clock signal and a data signal into one signal stream. Generally, a transmitter and a receiver are located at opposite ends of the serial data communications link. The receiver recovers the clock signal, and then uses the recovered clock signal to sample the data signal. The data signal comprises a series of ones and zeros, indicated by high and low voltage levels. The data signal transitions from high to low, or low to high, to convey information. The transitions should occur away from the point in time when the recovered clock indicates that the level of the data signal is to be sampled.

A condition referred to as jitter occurs when the transitions in the data signal fail to occur at a preferred time relative to the recovered clock signal. Noise, poor signal propagation conditions, and imperfect transmitter and receiver design are common causes of jitter. Jitter generally manifests as a variation in the location of the transitions in the data signal relative to the clock signal. If the jitter is sufficiently severe, the data signal may transition at a point in time when it is due to be sampled, or even later. In such cases, the received data bit will be in error.

The period of the recovered clock defines the data rate. The period for transmission of one bit is called a unit interval (UI). By convention, the time period of a unit interval is normalized to 0.0 at the beginning of each interval and to 1.0 at the end of a unit interval. The data signal typically transitions from logic high to logic low or from logic low to logic high at the beginning and/or end of each unit interval. The data value is typically sampled in the middle of the unit interval, at a time corresponding to 0.5 UI, to avoid sampling the data signal during a data transition. Some receivers are designed to always sample in the middle of the unit interval. Other receivers are designed to allow sampling at an arbitrary location (phase) within the unit interval.

FIG. 1 is a graphical illustration 100 showing the effect of jitter on a serial data communications link. The diagram 100 includes a recovered clock signal 102 and an ideal data signal 104. In this example, the preferred alignment time is illustrated at 114 on an exemplary negative transitioning clock edge 110 of a clock pulse 111. The ideal data signal 104 includes an exemplary data transitioning edge 117 on a pulse 116. The unit interval 112 of the pulse 116 is shown from 0.0 through 1.0. As shown in FIG. 1, the alignment time 114 and the ideal data signal 104 transitioning at 0.5UI with respect to the alignment time 114 results in the nominal sample location at 0.5 UI, illustrated at 115.

A data signal having minimal jitter is illustrated at 106. The data signal 106 is offset in time from the ideal data signal 104, and from the clock signal 102, by an amount shown at 118. The data signal 106 includes an exemplary pulse 124. The jitter indicated at 118 is sufficiently small so that the pulse 124 is sampled at a point in time relative to the transitioning edge 110 of the clock signal 102 so that the sampled data represented by the pulse 124 will likely be accurate.

A data signal having significant jitter is illustrated at 108. The data signal 108 includes a pulse 126. In this example, a transitioning edge 127 of the pulse 126 occurs coincident to the nominal sample location 115. In this example, the negative transitioning edge 127 of the pulse 126 occurs coincident to the nominal sample time 115, so that when the data associated with the pulse 126 is sampled at the nominal sample time 115, the sampled value will be potentially in error.

It is desirable in serial data communications link design to ensure that the transmitter, channel, and receiver are all designed to keep jitter within acceptable bounds. An acceptable bound for jitter should also include a margin to allow for natural variation in hardware characteristics from device to device or over time and environmental changes for a single device. The Bit Error Ratio, BER, is representative of the ratio of erroneous bits received to the total number of bits transmitted during a defined period of time of operation of the serial data communications link. A BER measurement is performed by transmitting a known data pattern and performing a comparison of expected to actual data received at the receiver. Some transmitters and/or receivers include the ability to adjust various parameters, such as the phase of the receiver during sampling. A common way of depicting the relation of BER to a parameter such as receiver phase is by the use of a so called "eye pattern" or "eye width." An eye pattern is a graphical way of visually indicating the performance of a communications link.

One previous method for measuring the eye width was to measure the BER at each phase setting for an equal amount of time. For receivers with a phase adjustment with many positions, this can be a long and error prone process. For example, for a receiver with 32 positions, running a bit error ratio test (BERT) for 1 minute at each position means that there will be 32 manually collected data points, and take over 32 minutes to collect the data.

The measurement of link quality generally includes running a series of BER measurements while sweeping the receiver's sampling phase across the unit interval. The transmitter sends the selected bit pattern continuously. Each measurement is performed by (1) setting the receiver's sampling phase offset, (2) clearing error and bit counters in the receiver, (3) running the receiver and associated error and bit counters for a period of time (the measurement "dwell" time), (4) unloading and saving the values in the error and bit counters after the desired dwell time, and (5) repeating this process for each phase offset. The result is a table of BER values versus receiver phase setting.

A common representation of the swept BER measurement is referred to as a "bathtub" plot. This plot gets its name from the distinctive curves, resembling the sloping ends of a bathtub. A disadvantage of a bathtub curve is that while mathematically accurate, careful examination and familiarity are required to develop a feel for the overall quality of the serial communications link. While acceptable for experts, novices find such a curve difficult to interpret.

Therefore, it is desirable to have the ability to quickly measure the eye width of a serial communications channel, and to have the ability to display the performance parameters of a serial communications link in an easy to read and intuitive manner.

SUMMARY

In accordance with an embodiment, a system for measuring performance of a serial communications link includes a system under test including at least one transmitter and at least one receiver coupled together via a serial data communications link, wherein at least one of the transmitter and the receiver has at least one tunable parameter, at least one controller coupled to at least one of a transmitter and a receiver via a joint test action group JTAG interface, and logic configured to perform a bit error ratio test (BERT) at a plurality of receiver phase locations over a defined time period and concluding the BERT for a particular phase location if a BERT error count is greater than 0 at the particular phase location.

Other embodiments and methods of the invention will be discussed with reference to the figures and to the detailed description.

BRIEF DESCRIPTION OF THE FIGURES

The invention will be described by way of example, in the description of exemplary embodiments, with particular reference to the accompanying figures.

DETAILED DESCRIPTION

Figure 1:
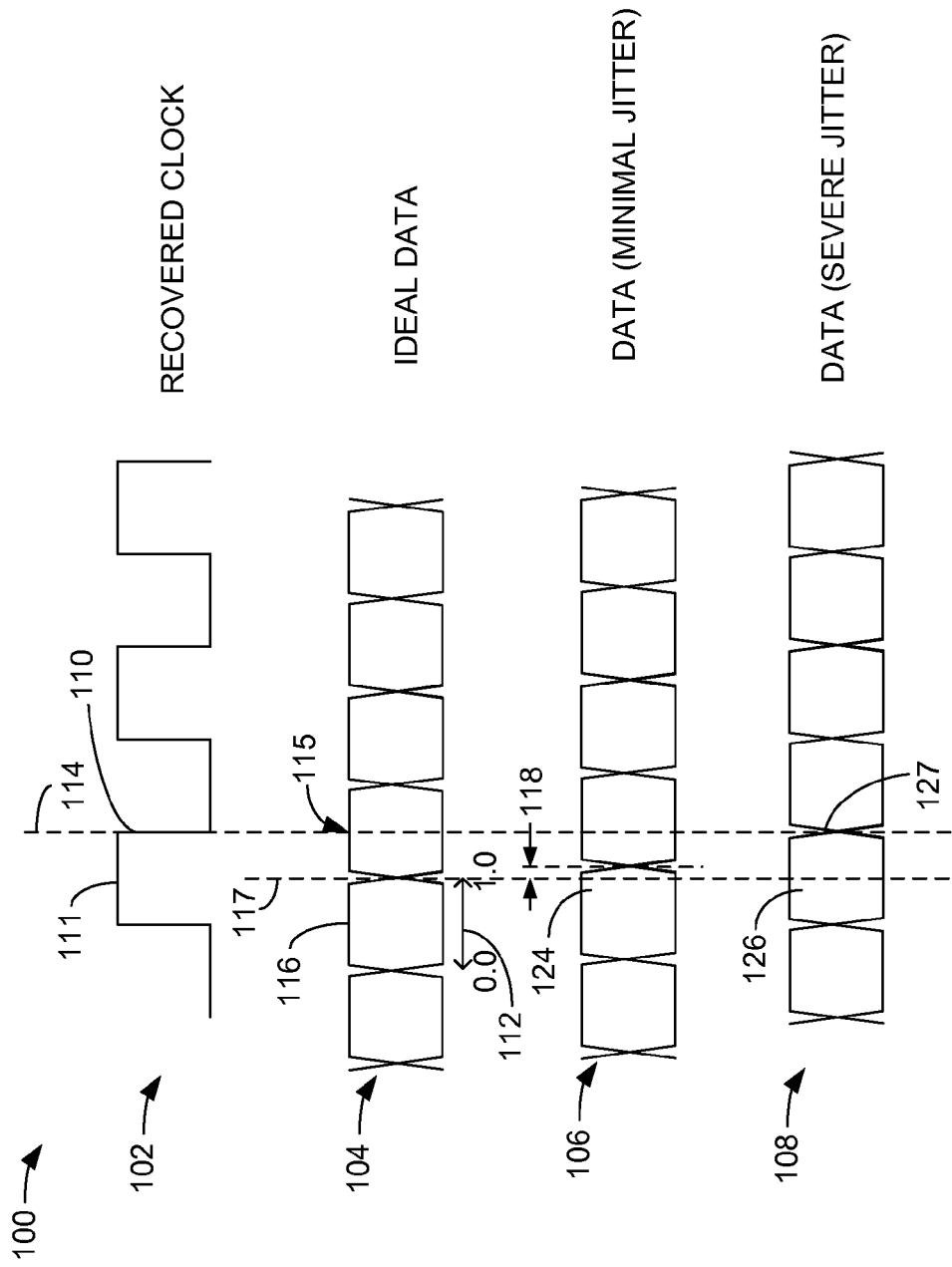
FIG. 1 is a graphical illustration showing the effect of jitter on a serial data communications link.

The Institute of Electrical and Electronic Engineers (IEEE) has published a specified protocol for communicating with a single integrated circuit (IC) chip or a chain of chips. The communication protocol is promulgated by the joint test action group (JTAG) under the IEEE 1149.1 specification. This protocol allows external applications to both write and read from integrated circuits for debugging, and for other purposes. JTAG boundary scan started as a method of testing ICs and their interconnections using a shift register built into the chip so that inputs could be shifted in and the resulting outputs could be shifted out using only four I/O pins (clock, input data, output data, and state machine mode control). However, the IEEE 1149.1 specification also provides an application programmatic interface (API) that allows communication with registers on the chip on which the transmitters and receivers are located. This communication also allows for additional control of the transmitter and receiver associated with a serial data communications link.

While described below for use in an integrated circuit, the system and method for measuring and depicting the performance of a serial communications link can be used to measure and depict performance of any serial data communications link, whether it uses a clock embedded with the data or transmitted alongside the data on an independent connection.

While generally implemented in software, the system and method for measuring and depicting the performance of a serial communications link can be implemented in hardware, software, or a combination of hardware and software. If implemented in hardware, the system and method for measuring and depicting the performance of a serial communications link can be implemented using specialized hardware elements and logic. When the system and method for adjusting a serial communications link is implemented in hardware or software, the logic can be used to control various components so that various operating aspects can be software-controlled. The software can be stored in a memory and executed by a suitable instruction execution system (e.g., a microprocessor). A hardware implementation of the system and method for measuring and depicting the performance of a serial communications link can include any or a combination of the following technologies, which are all well known in the art: discrete electronic components, a discrete logic circuit(s) having logic gates for implementing logic functions upon data signals, an application specific integrated circuit having appropriate logic gates, a programmable gate array(s) (PGA), a field programmable gate array (FPGA), etc.

The software for the system and method for measuring and depicting the performance of a serial communications link comprises an ordered listing of executable instructions for implementing logical functions, and can be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

In the context of this document, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection (electronic) having one or more wires, a portable computer diskette (magnetic), a random access memory (RAM), a read-only memory (ROM), an erasable programmable read-only memory (EPROM or Flash memory) (magnetic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

Figure 2:
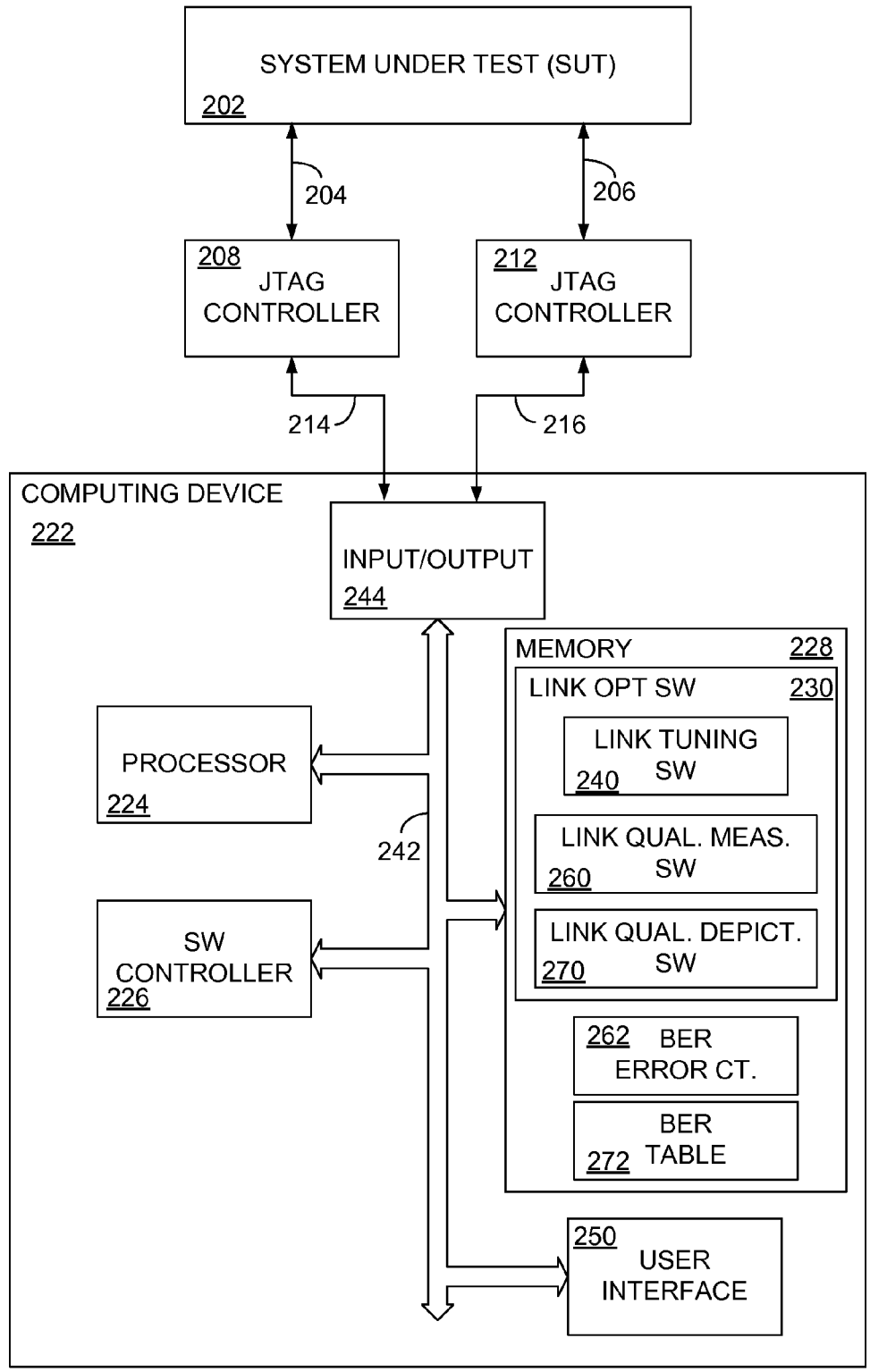
FIG. 2 is a schematic diagram illustrating an example of a system in which the system for adjusting a serial communications link can be implemented.

FIG. 2 is a schematic diagram illustrating an example of a system 200 in which the system for measuring and depicting the performance of a serial communications link can be implemented. The system 200 includes a system under test (SUT) 202 connected to a computing device 222 via, in this example, a pair of JTAG controllers 208 and 212. The JTAG controllers 208 and 212 are configured to implement the communication protocol specified in IEEE standard 1149.1. However, other communication standards are contemplated and can be implemented by the JTAG controllers 208 and 212. Further, although two JTAG controllers are shown, a single JTAG controller may be implemented.

The system under test 202 can be, for example, an integrated circuit, a number of different integrated circuits, or any other circuitry that includes a serial communications link between at least two devices (not shown) within the system under test 202. The JTAG controller 208 is connected to the system under test 202 via connection 204 and is connected to the computing device 222 via connection 214. The JTAG controller 212 is connected to the system under test 202 via connection 206 and is connected to the computing device 222 via connection 216. The connections 214 and 216 can be any bi-directional data communication connection, such as, for example, a universal serial bus (USB), an RS-232 connection, a parallel connection, or any other bidirectional data connection known in the art.

The connections 204 and 206 can be any general-purpose communication connections capable of carrying the signals used by the JTAG controllers, such as for example, a five conductor signal cable carrying ground and the four signals (clock, input data, output data, and state machine control mode) defined by the IEEE 1149.1 JTAG standard.

The computing device 222 can be any general purpose computing device or specialized computing device, and typically includes a processor 224, a memory 228, a software controller 226, an input/output element 244 and a user interface 250 coupled together via interface 242. The interface 242 can be a physical connection, a logical connection, or a combination of physical and logical connections that enable bi-directional communication among the connected elements.

The memory 228 includes a number of software elements (not shown) that enable the computer 222 to operate. The memory 228 also includes link optimization software 230. The link optimization software 230 includes a number of different software components, and in this embodiment, includes link tuning software 240, link quality measurement software 260 and link quality depiction software 270. The link quality measurement software 260 also has access to a bit error ratio test (BERT) counter 262. The link quality depiction software 270 includes a BER table 272 that includes information that relates the bit error ratio to receiver phase. As will be described below, the link tuning software 240 provides testing and adjustment functionality to the transmitters and receivers (not shown in FIG. 1) within the system under test 202. The link quality measurement software 260 provides a fast and efficient measurement of link quality, including the measurement of eye pattern quality, and the link quality depiction software 270 provides a simple and effective visual indication of link quality that can be understood by those having a modest understanding of serial communications links.

The input/output element 244 provides the connectivity via connections 214 and 216 to the JTAG controllers 208 and 212, respectively. However, the JTAG controllers 208 and 212 can be coupled to the computing device 222 via other connections.

The user interface 250 provides visibility and control of the link optimization software 230, the link tuning software 240, the link quality measurement software 260 and the link quality depiction software 270. The user interface 250 provides a user with a graphical user interface that allows various aspects of the link optimization software 230, the link tuning software 240, the link quality measurement software 260 and the link quality depiction software 270 to be controlled. The graphical user interface also allows a user to control, adjust and tune various operating aspects of a transmitter and a receiver (not shown in FIG. 1) associated with a serial data communications link within the system under test 202.

Figure 3:
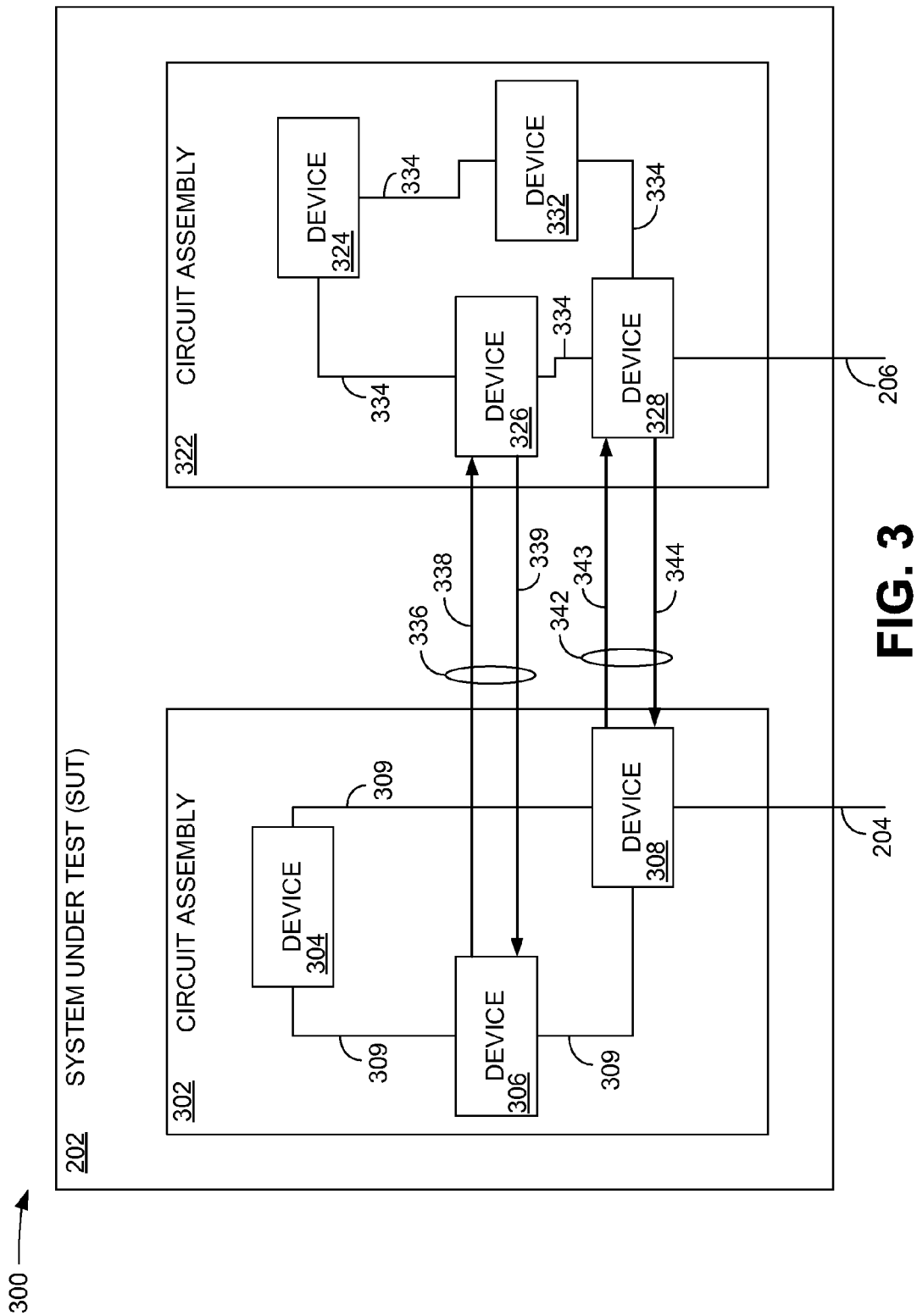
FIG. 3 is a schematic diagram illustrating the system under test of FIG. 2.

FIG. 3 is a schematic diagram 300 illustrating the system under test 202 of FIG. 2. In this example, the system under test 202 includes a circuit assembly 302 and a circuit assembly 322. Two circuit assemblies are shown for convenience of illustration. Any number of circuit assemblies can be implemented. The circuit assemblies 302 and 322 can be circuit boards, integrated circuit assemblies, or any type of element on which circuit devices are located. The circuit assembly 302 includes devices 304, 306 and 308. The devices 304, 306 and 308 can be any integrated circuit device, component, or combination of devices and components. At least some of the devices 304, 306 and 308 include a transmitter and a receiver. However, not all of the devices 304, 306 and 308 need include both a transmitter and a receiver.

The devices 304, 306 and 308 are connected via a scan chain 309. As known to those skilled in the art, a scan chain, such as the scan chain 309, can be formed by interconnecting various components and elements within each of the devices 304, 306 and 308. Some or all of the components and elements within each of the devices 304, 306 and 308 can be in communication via the scan chain 309, typically based upon JTAG control settings.

In this example, the system under test 202 also includes a circuit assembly 322. In this example, the circuit assembly 322 includes devices 324, 326, 328 and 332. The devices 324, 326, 328 and 332 can be any integrated circuit device, component, or combination of devices and components. At least some of the devices 324, 326, 328 and 332 include a transmitter and a receiver. However, not all of the devices 324, 326, 328 and 332 need include both a transmitter and a receiver.

The devices 324, 326, 328 and 332 are connected via a scan chain 334. As known to those skilled in the art, a scan chain, such as the scan chain 334, can be formed by interconnecting various components and elements within each of the devices 324, 326, 328 and 332. Some or all of the components and elements within each of the devices 324, 326, 328 and 332 can be in communication via the scan chain 334, typically based upon JTAG control settings.

The elements within the system under test 202 are shown for example purposes only. More or fewer devices, circuits, and scan chains may exist within the system under test 202.

In this example, the devices 306 and 326 are coupled via a serial communications link 336. The serial communications link 336 includes connections 338 and 339. In this example, the connection 338 is shown as extending in the direction from device 306 to device 326 and the connection 339 is shown as extending in the direction from device 326 to device 306. However, the direction of the connections 338 and 339 is arbitrary. The connection 338 and the connection 339 each generally comprise a differential pair having controlled impedance, but are shown as a single line for ease of illustration. Typically, the serial communications link 336 allows the connection of a transmitter in one device and a receiver in the other device. The connection of a transmitter and receiver will be described below with respect to FIG. 4.

Similarly, the device 308 is connected to the device 328 via a serial communications link 342. The serial communications link 342 is similar to the serial communications link 336 and includes connections 343 and 344.

Although shown as connecting devices on separate circuit assemblies, such as circuit assemblies 302 and 322, a serial communications link can also be formed between a transmitter and receiver on devices located on the same circuit assembly. Further, a serial communications link can also be formed between a transmitter and a receiver located on the same device. All such serial communications links can be controlled and adjusted in accordance with the description to follow.

Figure 4:
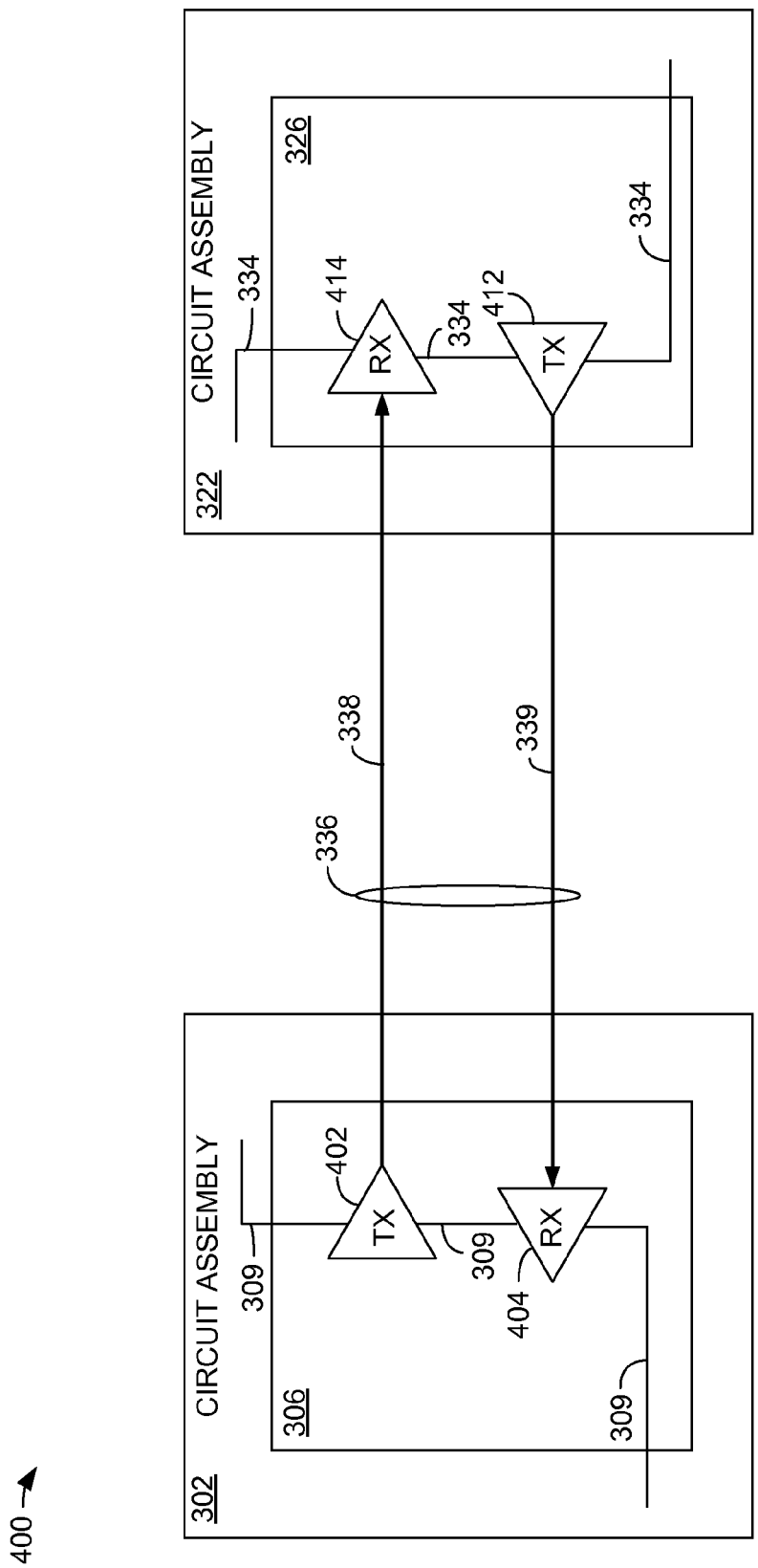
FIG. 4 is a schematic diagram illustrating in further detail the serial communications link between two devices of FIG. 3.

FIG. 4 is a schematic diagram 400 illustrating in further detail the serial communications link 336 between the device 306 and the device 326 of FIG. 3. The device 306 includes a transmitter 402 and a receiver 404. The device 326 includes a transmitter 412 and a receiver 414. The transmitters 402 and 412 can be any serial communication device transmitters having operating parameters that can be adjusted using, for example, a JTAG IEEE 1149.1, or similar, interface. For example, the data pattern, transmission speed, transmit pre-emphasis, drive signal strength and output impedance are examples of adjustable transmitter operating parameters.

The receivers 404 and 414 can be any serial communication device receivers having operating parameters that can be adjusted using, for example, a JTAG IEEE 1149.1, or similar, interface. For example, the data pattern, linear equalization, gain and decision feedback equalization (DFE) are examples of adjustable receiver operating parameters.

In this example, the transmitter 402 is connected to the receiver 414 via connection 338 and the transmitter 412 is connected to the receiver 404 via connection 339. In this manner, a serial communications link 336 is established between the device 306 and the device 326. It should be mentioned that although a single transmitter and receiver are shown in each of the devices 306 and 326, each of the devices 306 and 326 may include additional transmitters and receivers, the additional transmitters and receivers possibly being connected via other serial communications links.

The scan chain 309, which provides the control interface to the device 306, is shown as extending from a point external from the device 306, through the transmitter 402 and the receiver 404, and then off of the device 306. Similarly, the scan chain 334, which provides the control interface to the device 326, is shown as extending from a point external from the device 326, through the transmitter 412 and the receiver 414, and then off of the device 326. In this manner, individual operational aspects and parameters of each transmitter 402 and 412, and each receiver 404 and 414, can be individually controllable, adjustable, and variable, via the JTAG interface provided over connection 204 to the scan chain 309 and from connection 206 to the scan chain 334.

As will be described below, the link tuning software 240, operating through the software controller 226 and the JTAG controllers 208 and 212, can adjust the operating performance of the transmitters and receivers to optimize the performance of the serial communications link 336.

Figure 5:
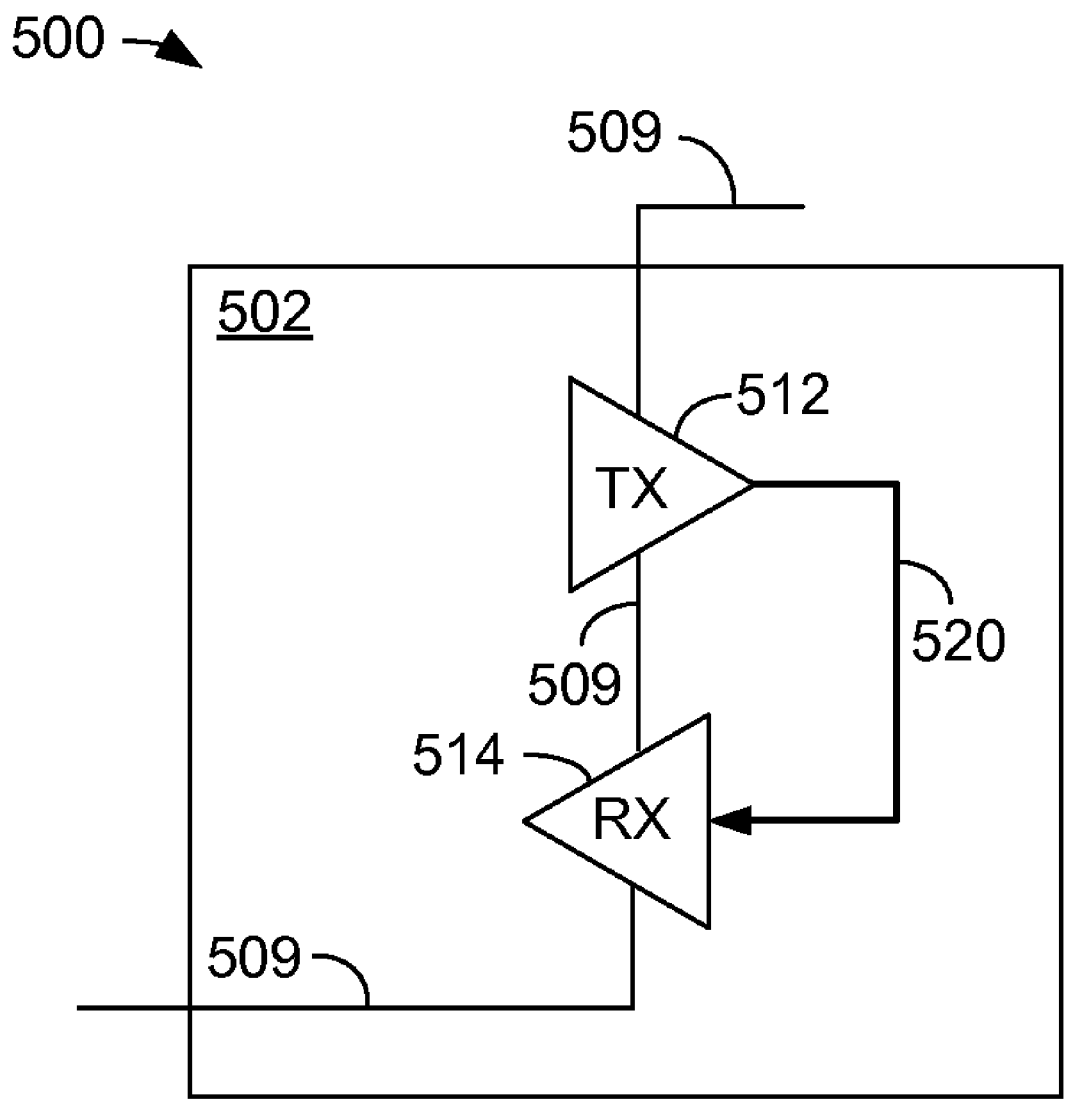
FIG. 5 is an alternative embodiment of the serial communications link shown in FIG. 4.

FIG. 5 is an alternative embodiment of the serial communications link shown in FIG. 4. The system 500 shown in FIG. 5 includes a device 502. The device 502 is similar to the devices 302 and 322 described above. The device 502 includes an exemplary transmitter 512 and an exemplary receiver 514. A single transmitter 512 and a single receiver 514 are shown for simplicity. A typical device 502 will contain many hundreds or thousands of transmitters and receivers.

The embodiment shown in FIG. 5 illustrates an environment referred to as a "loopback" test environment in which a transmitter and a receiver located on the same device are coupled together via a serial data communications link 520. The transmitter 512 and the receiver 514 are also coupled to a scan chain 509. The scan chain 509 is similar to the scan chain 309 described above. Alternatively, another loopback test configuration is referred to as an "external loopback" configuration in which an external signal path is connected to deliver the output of the transmitter 512 to the input of the receiver 514 via external cabling or other means.

The scan chain 509, which provides the control interface to the device 502, is shown as extending from a point external from the device 502, through the transmitter 512 and the receiver 514, and then off of the device 502. In this manner, individual operational aspects and parameters of the transmitter 512 and the receiver 514 can be individually controllable, adjustable, and variable, via the JTAG interface provided over connection 204 to the scan chain 509. In the embodiment shown in FIG. 5, a single JTAG controller, such as the JTAG controller 208 of FIG. 2, can be coupled to the scan chain 509 to control the transmitter 512 and the receiver 514.

The link tuning software 240, operating through the software controller 226 and the JTAG controllers 208 and 212, can adjust the operating performance of the transmitter 512 and the receiver 514 to optimize the performance of the serial communications link 520.

Figure 6:
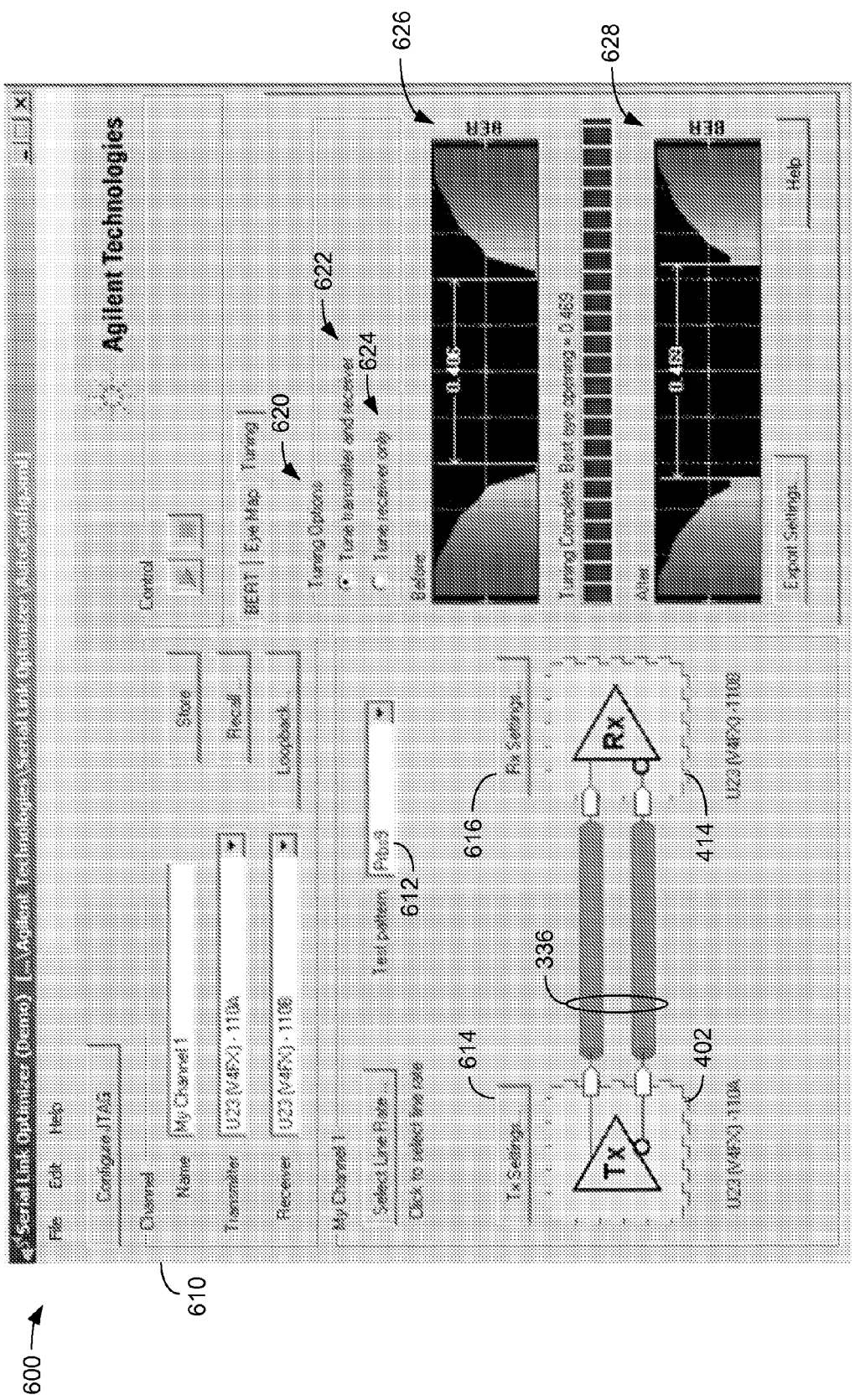
FIG. 6 is a graphical illustration showing an example of a graphical user interface provided to a user.

FIG. 6 is a graphical illustration 600 showing an example of a graphical user interface provided to a user. The graphical user interface 610, which is provided by the user interface 250 (FIG. 2), provides visibility and the adjustability of the transmitter and receiver of an exemplary communication link.

Figure 7:
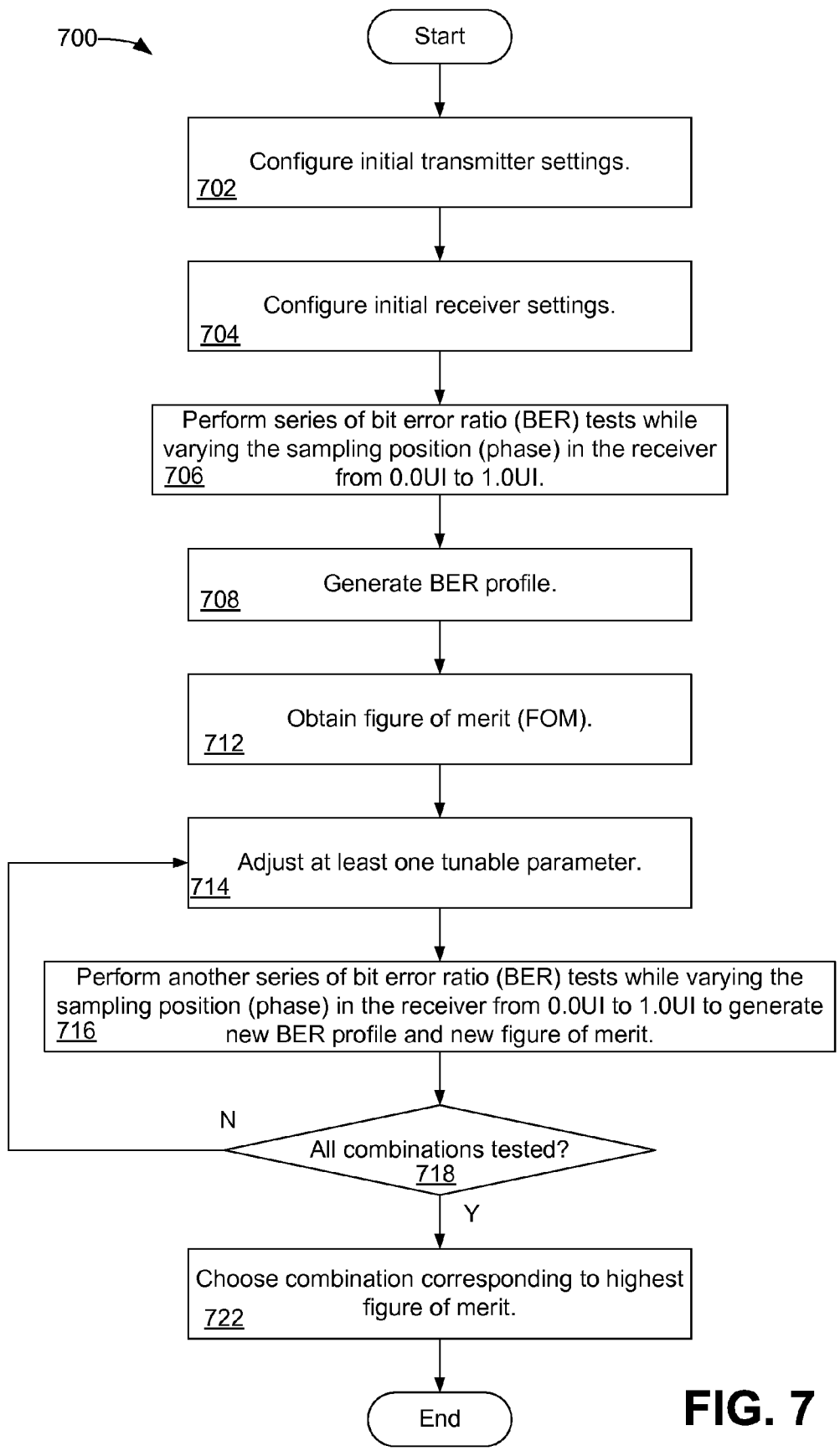
FIG. 7 is a flow chart describing the operation of an embodiment of a system and method for adjusting a serial communications link.

FIG. 7 is a flow chart 700 describing the operation of an embodiment of the system and method for adjusting a serial communications link. The blocks in the flowchart 700 can be performed in the order shown, out of the order shown, or substantially in parallel. Further, the description of the flowchart 700 will make reference to the arrangement of transmitters and receivers depicted in FIG. 4. However, the method described in the flowchart 700 is applicable to any serial communications link having at least one adjustable transmitter and/or at least one adjustable receiver.

In block 702 the initial settings of the transmitter 402 are configured. These settings include, for example, the data pattern to be sent and the speed at which the data pattern will be sent. As an example, and referring to FIG. 6, the test pattern can be a PRBS9 test pattern, which is known to those skilled in the art and which is illustrated at 612, or can be another test pattern. Other transmitter settings can be chosen by selecting the transmit settings button 614. Selecting the transmit settings button 614 opens an additional selection window (not shown) to adjust various transmitter parameters.

In block 704, the initial settings of the receiver 414 are configured. These settings include, for example, receiver sensitivity. The receiver settings can be chosen by selecting the receiver settings button 616. Selecting the receiver settings button 616 opens an additional selection window (not shown) to adjust various receiver parameters.

In block 706, the link tuning software 240 performs a series of bit error ratio (BER) measurements while varying the sampling position (phase) of the recovered data signal in the receiver from 0.0 to 1.0 UI. Such a series of BER measurements is sometimes referred to as a "sweep." Alternatively, the sampling position (phase) of the recovered data signal is varied over whatever range is supported by the particular receiver. The result of this series of BER measurements is a profile of the BER as a function of receiver phase. The BER profile is generated in block 708. The BER profile is known in the art as a "bathtub curve". This curve is shown in FIG. 6 using reference numeral 626 for one such sweep. In this case there is a clear receive window, also referred to as an "eye opening" of 0.406 UI, where no errors were detected in the received data. In general, a wider opening is preferable because a wider opening means that the jitter in the data signal is less likely to violate the nominal sample position at 0.5 UI. In accordance with an embodiment of the system and method for measuring and depicting performance of a serial communications link, the link quality depiction software 270, an embodiment of the operation of which will be described below, can be used to visually illustrate the "eye opening" in a number of different ways.

In block 712, a single "figure of merit (FOM) is obtained. The objective of the sweep is to obtain the single figure of merit value that characterizes the quality of the serial communications link 336 when operated with a given set of transmitter and/or receiver settings, such as the settings chosen in blocks 702 and 704.

The figure of merit chosen in this embodiment is calculated as follows: (a) if a clear eye opening is found in the BER sweep, FOM=1.0+openingUI, or (b) if no eye opening is found, FOM=1.0−BERmin, the lowest BER found in the sweep. With the FOM defined this way, the quality of the serial data communications link can be characterized using a simple numerical comparison.

In block 714 the link tuning software 240 adjusts at least one tunable parameter of the transmitter, at least one tunable parameter of the receiver, or at least one tunable parameter of the transmitter and the receiver.

In block 716, the link tuning software 240 than takes another BER sweep for the new combination of settings applied in block 714 and generates a new figure of merit for the settings applied in block 714. In block 718 it is determined if all combinations of transmitter and receiver settings have been tested. If all combinations of transmitter and receiver settings have not been tested, then the process returns to block 714. If all combinations of transmitter and receiver settings have been tested, the process proceeds to block 722 where the highest figure of merit is chosen as "optimal." A curve 628 corresponding to the optimal figure of merit is shown in FIG. 6.

It can be appreciated that an exhaustive search through all combinations may be time consuming. An alternative is to determine the gradient of the figure of merit through the N-space of N different parameters and follow the gradient "uphill" to the highest figure of merit. This technique works best if the performance of the transmitter, receiver and the serial data communications link are consistent from test to test over varying performance parameters with a single global maximum value for the figure of merit.

Figure 8:
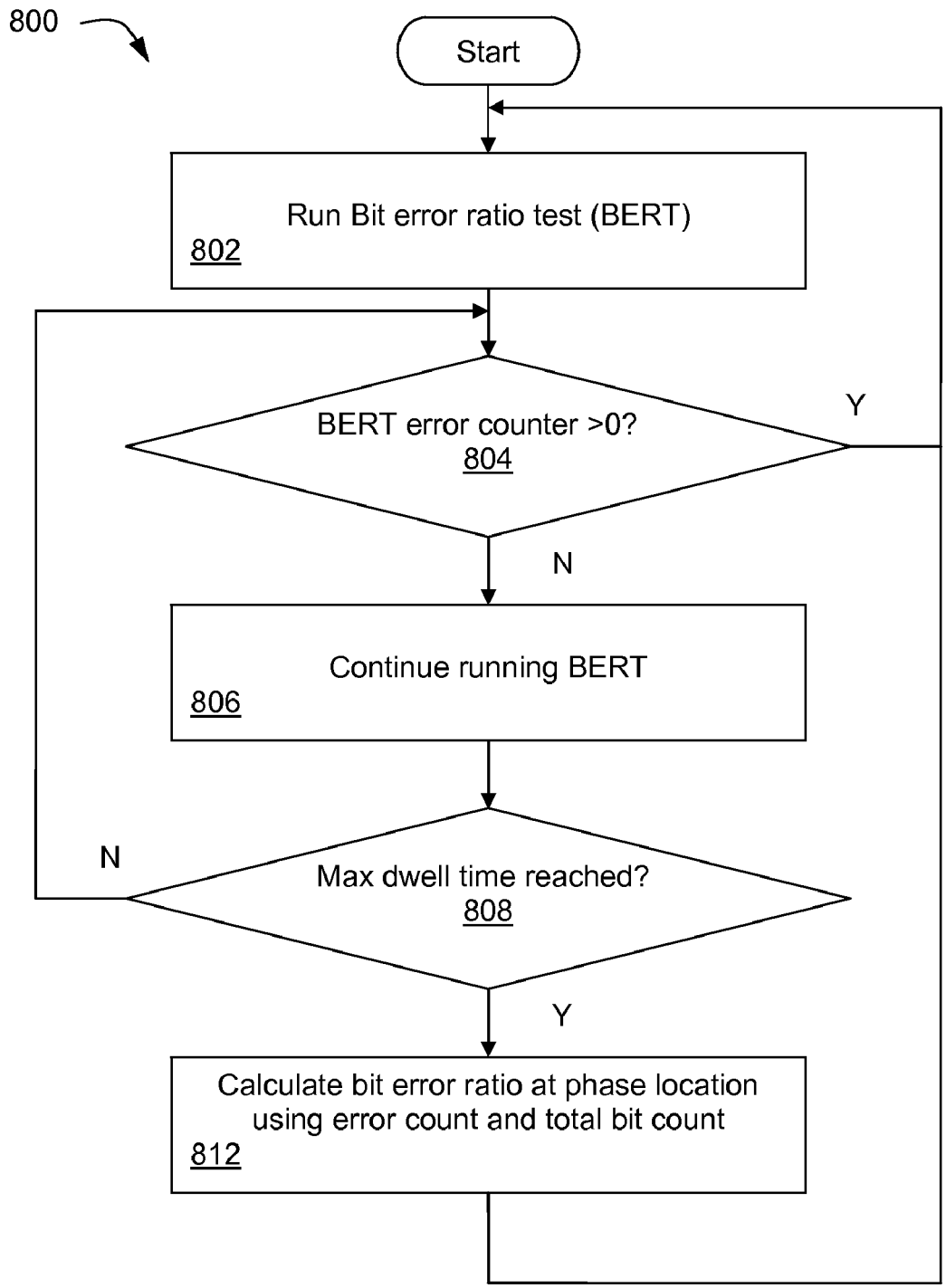
FIG. 8 is a flow chart describing the operation of an embodiment of a system and method for measuring the performance of a serial communications link.

FIG. 8 is a flow chart describing the operation of an embodiment of a system and method for measuring the performance of a serial communications link. In block 802, the link quality measurement software 260 runs a bit error ratio test (BERT) on a serial communication link at each phase location. In block 804, after running the BERT for a relatively short time, such as, for example, 10 msec, it is determined whether the bit error count is greater than 0. If the bit error count is greater than 0, then the BERT is concluded and the BER for that phase location is calculated in block 812. This process is performed at each receiver phase. Ideally, relatively more measurement time is dedicated to the phase locations where the BER is low or zero and less measurement time is dedicated to the phase locations at which the BER is clearly nonzero. The goal is to perform each sweep as quickly as possible while preserving sensitivity at the phase locations where errors are rare. For example, if the BER at a particular phase position is $10^{-6}$ on a 2 Gbit/sec serial channel, then one or two errors should be detected every millisecond. If the maximum dwell time is set to 500 msec and the incremental dwell time is set to 10 msec, 490 msec of test time can be saved by moving on to the next phase position, which may have a BER of 10.sup.-9 and require a longer measurement time to be seen. If in block 804 it is determined that the bit error count is not greater than 0, then, in block 806, the BERT is continued. In block 804 the bit error count is continuously checked to determine whether the error count is greater than 0, and if so, the BERT is concluded.

In block 808 it is determined whether the maximum dwell time is reached. The maximum dwell time is selected by the user. The maximum dwell time should be adjusted to attempt to ensure a BER of a specific amount. For example, for maximum accuracy, the maximum dwell time should decrease as the BER increases. The dwell time determines the maximum sensitivity of the BER measurement at each phase position. For example, if the maximum dwell time is 500 msec on a 2 Gbit/sec serial link, then the BER measurement will observe at most $10^9$ bits. Such a test would likely detect an error rate as low as $10^{-9}$, but be insensitive to error rates below that.

If the maximum dwell time is reached, then, the BERT is concluded and the BER for that phase location is calculated in block 812. If the maximum dwell time is not reached, then the process returns to block 804 where the BERT continues until the error counter reaches a value greater than 0 or until the maximum dwell time is reached.

In this manner, a valid bit error ratio is calculated, but for all the phase positions in the unit interval in which errors have occurred, no additional time is spent refining the bit error ratio. This is an efficient use of test time because the most important region of the unit interval in which a user is most interested, is the area in which there are no or few errors.

Figure 9:
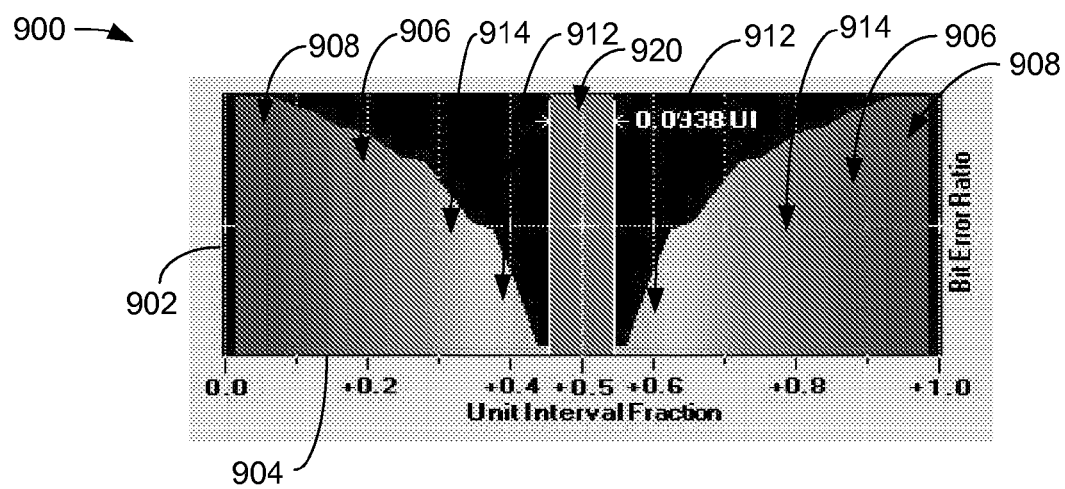
FIG. 9 is a plot illustrating the performance of a serial communications link.

FIG. 9 is a plot 900 illustrating the performance of a serial communications link. In an embodiment, the system and method for depicting the performance of a serial communications link, and in particular, the link quality depiction software 270, displays bit error ratio (BER) values on the vertical axis 902 versus phase on the horizontal axis 904 in at least two ways by using an envelope 906 in combination with color variations. The height of the envelope 906 is related to the logarithm of the measured BER at each receiver phase. For example, such a relation might be height=maxHeight*(1−(log(BER)/log(BERmin))), where: maxHeight=the available vertical span, BER=the measured BER at the phase position, and BERmin is the minimum BER obserservable given the maximum dwell time of the measurement. An additional test could be added to ensure the height is at least one if the measured BER is nonzero. The coloring within the envelope is a color graded representation of the BER value. By combining a color representation with the height representation, the display quickly conveys both qualitative and quantitative information.

In an embodiment, an exemplary color grading is as follows. Red, which is generally indicated at 908, represents high ("bad") BER values. Green, which is generally represented at 912, represents low ("good") values. Yellow, which is generally represented at 914, represents a BE between the BER represented by green 912 and the BER represented by red 908. An off-green shading, represented at 920, between the dimension lines shows the "clear eye opening"—the portion of the unit interval where no errors were observed. In the example shown in FIG. 9, the clear eye opening is 0.0938 unit interval. The colors used in this example are chosen to be intuitive in how they relate to the performance of the serial communications link. The colors can be any colors chosen by a user to be representative of the relative performance of the serial communication link.

The system and method for depicting the performance of a serial communications link exploits the human power of visual recognition to quickly convey the salient characteristics of the jitter distribution in a serial communications link. Color grading a Cartesian coordinate display quickly conveys the nature of the jitter distribution. Shading the eye opening calls attention to it. Comparing results for different channels or for one channel under different circumstances can be performed at a quick glance. Since the goal of optimizing the operation of a serial channel is finding the widest eye opening, highlighting the width of the clear opening makes comparison quick and easy.

Figure 10A:
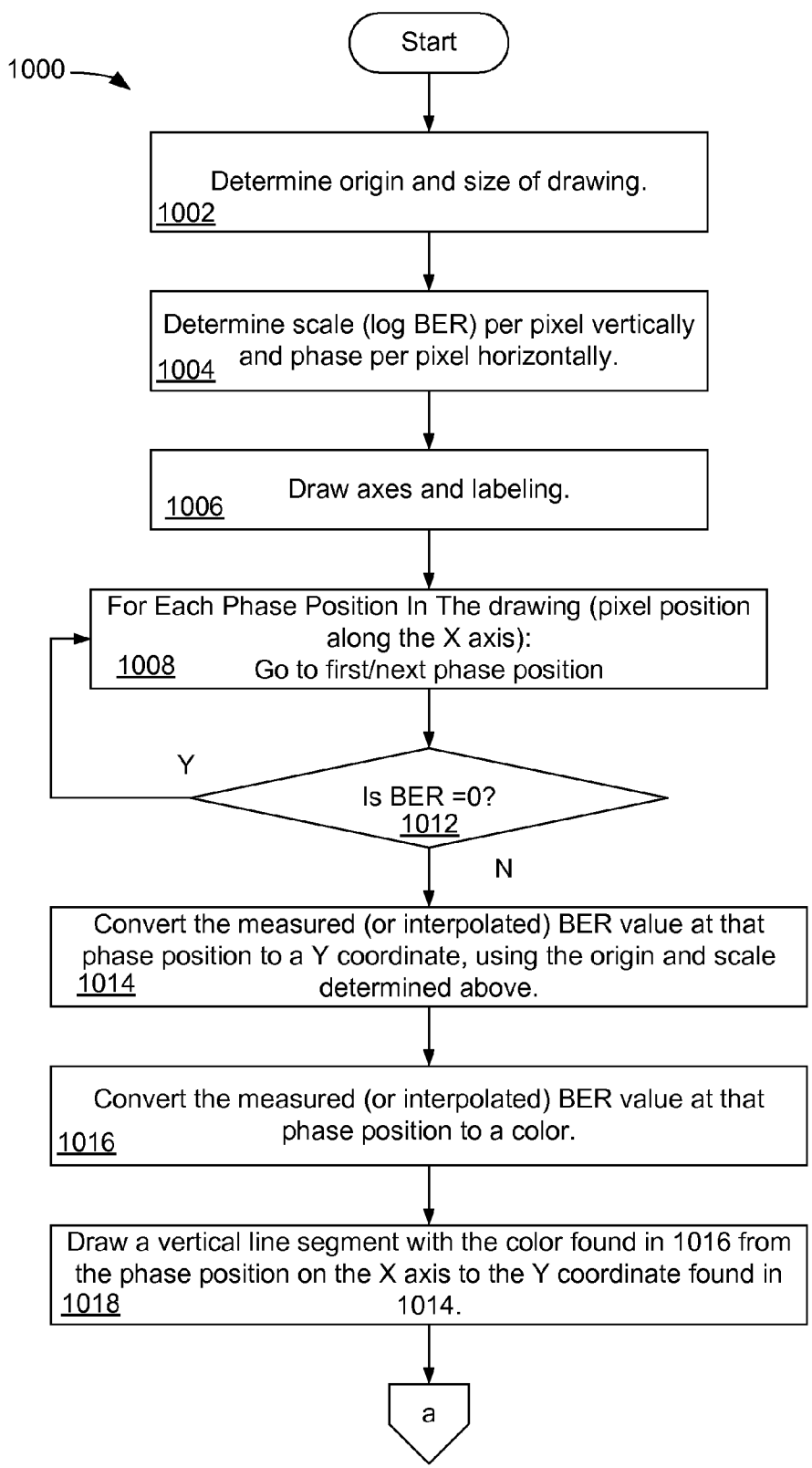
FIGS. 10A and 10B are a flow chart describing the operation of an embodiment of a system and method for depicting the performance of a serial communications link.
Figure 10B:
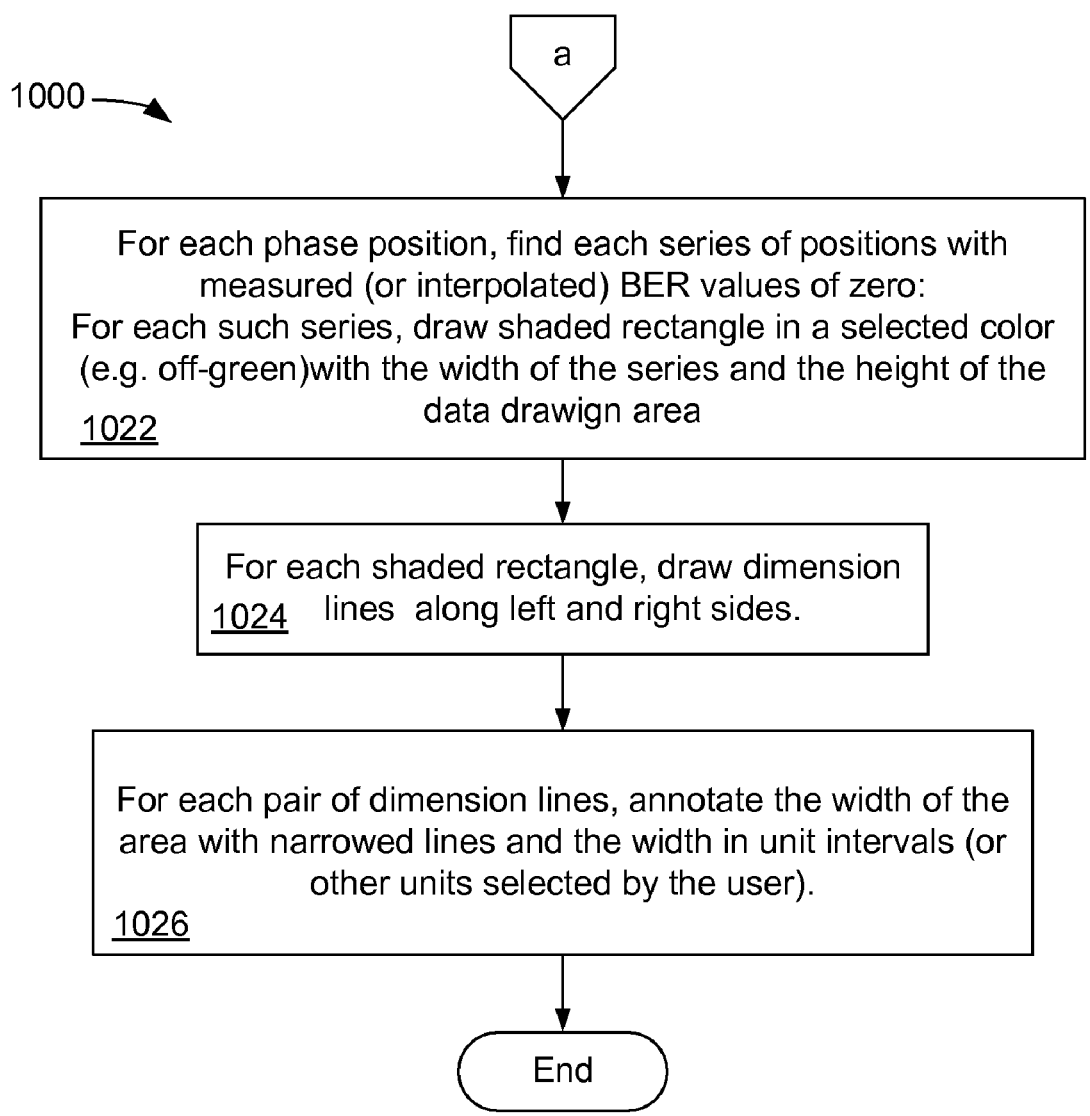

FIGS. 10A and 10B are a flow chart describing the operation of an embodiment of a system and method for depicting the performance of a serial communications link. The primary inputs to the link quality depiction software 270 are a table or list of BER values versus receiver phase, obtained from the BER table 272, the desired size for the depiction, a color grading transform to convert a value in a range of values to a color from a range of colors, and annotation properties (units, titles, etc.). The desired size for the depiction may be fixed and determined when the GUI 250 (FIG. 2) layout is designed. Alternatively, standard controls may be added to the GUI to allow the user to adjust the size of the depiction. The color grading transform to convert a value in a range of values to a color from a range of colors is known in the art and is commonly used in oscilloscopes and in visualization software, such as, for example Matlab. The annotation properties (units, titles, etc.) are designed into the GUI. They may be fixed (e.g. the x-axis is always "UI") or selectable by the user (e.g. the x-axis is "UI", or time, or percent of UI).

Figure 11:
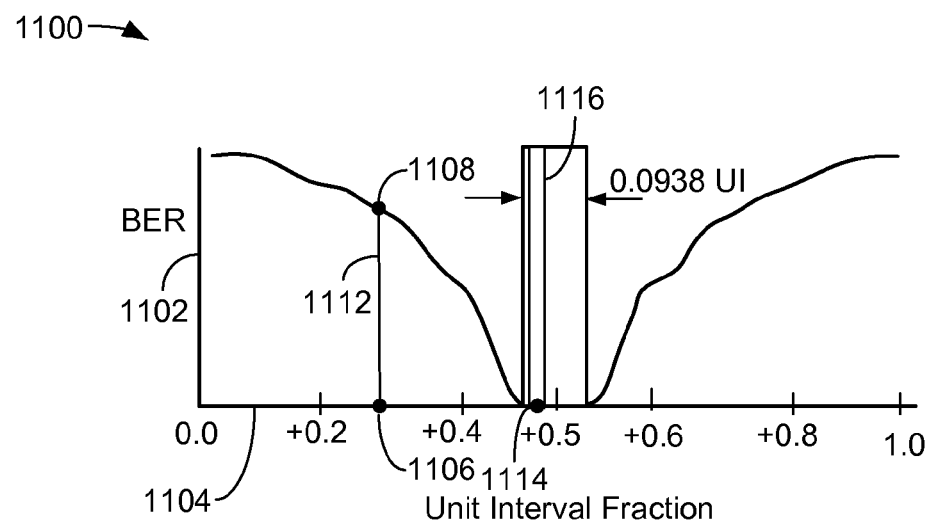
FIG. 11 is a graphical depiction illustrating a performance curve generated by the system and method for depicting the performance of a serial communications link.

The operation of the embodiment described in FIGS. 10A and 10B will also be described with reference to FIG. 11. FIG. 11 is a graphical depiction illustrating a performance curve generated by the system and method for depicting the performance of a serial communications link.

In block 1002, the origin and size of the data drawing area are determined. In block 1004, a scale of (log BER) per pixel vertically and of phase per pixel horizontally is determined. In block 1006 the drawing area is cleared and axes and labeling are drawn. Referring to FIG. 11, the axes 1102 and 1104 are drawn and the labeling is drawn.

In block 1008, for each phase position in the drawing (pixel position along the X-axis), the process proceeds to the first (or next) phase location. The phase location refers to the phase at which the receiver samples data. An exemplary phase location is shown in FIG. 11 as exemplary phase location 11106.

In block 1012 it is determined if the BER for the phase location 1106 is equal to zero. If the BER measured for pixel location 1106 is zero, the process proceeds to block 1008 to the next phase position. If the BER measured for pixel location 1106 is not zero, the process proceeds to block 1014. In block 1014, the measured (or interpolated) BER value at that phase position (1106) is converted to a Y coordinate 1108, using the origin and scale found above.

In block 1016, the measured (or interpolated) BER value at that phase position (1106) is converted to a color. In block 1018, a vertical line segment 1112 with the color found in block 1016 is drawn from the phase position (1106) on the X-axis to the Y coordinate 1008 found in block 1014.

In block 1022, and for each phase position, each series of positions with measured (or interpolated) BER values of zero, such as exemplary position 1114 in FIG. 11, are found. For each such series, a shaded rectangle 1116 in a selected color (e.g. off-green) with the width of the series and the height of the data drawing area is drawn.

In block 1024, for each shaded rectangle, dimension lines along its left and right sides are drawn. In block 1026, for each pair of dimension lines, the width of the area is annotated with arrowed lines and the width in unit intervals (or other units selected by the user) is annotated. See, for example, FIG. 9 where the shaded rectangle 920 is dimensioned with horizontal arrow stubs on the left and right with the dimension ("0.0938 UI") annotated next to the arrow on the right side. If the shaded rectangle is wide enough, the dimensional arrows and annotation are drawn inside the shaded area.

Alternative embodiments include alternating color grading schemes, including gray scale, including non-linear color grading transforms to limit green shading to BER values deemed to be "good," as defined by user specification. Other alternative embodiments include shading the eye opening only when a pointer, such as one controlled by a mouse, hovers over the area, stacking the results of multiple scans along a simulated Z-axis, varying the color along the line segments in accordance with the color grading scheme so the portion of each segment closest to the X-axis is green, grading to yellow and then red as the top of the drawing area is reached (according to the preferred embodiment of color grading). Another alternative includes, for example, drawing the height of the envelope at a constant value across the display, but retaining the color rendering. This simplifies the graphic and is suitable for a smaller rendering area, perhaps where multiple measurements are stacked, one above another. In another alternative, the height relationship for BER values is inverted so higher (longer) line segments represent better (lower) values. This calls attention to the good areas by giving them more area than the bad areas.

Figure 12:
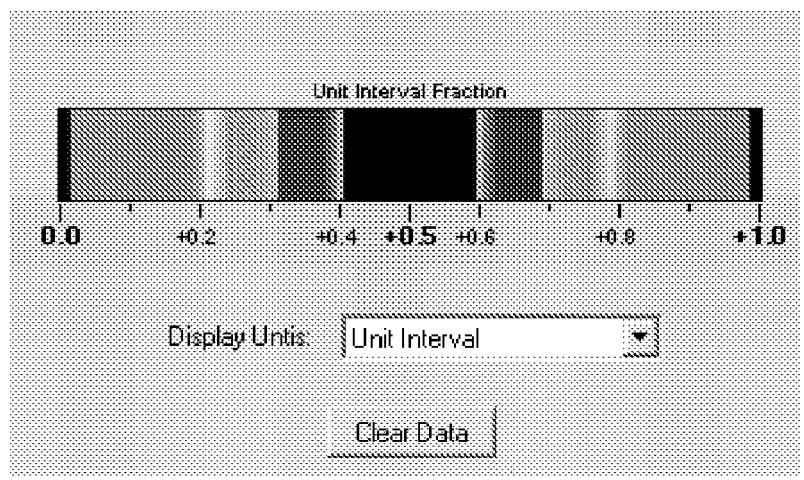
FIG. 12 is a graphical depiction illustrating the performance curve generated by the system and method for depicting the performance of a serial communications link in what is referred to as an "eye finder" style.

FIG. 12 is a graphical depiction illustrating the performance curve generated by the system and method for depicting the performance of a serial communications link in what is referred to as an "eye finder" style.

Figure 13:
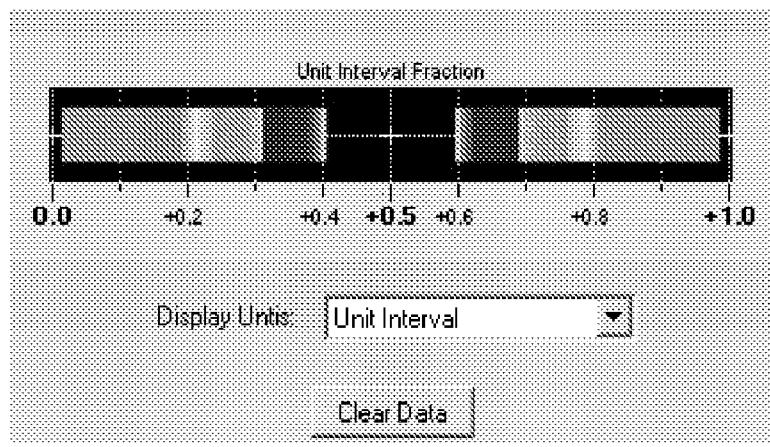
FIG. 13 is a graphical depiction illustrating the performance curve generated by the system and method for depicting the performance of a serial communications link in the "eye finder" style of FIG. 12 including graticule and black surround for context.

FIG. 13 is a graphical depiction illustrating the performance curve generated by the system and method for depicting the performance of a serial communications link in the "eye finder" style of FIG. 12 including graticule and black surround for context.

Figure 14:
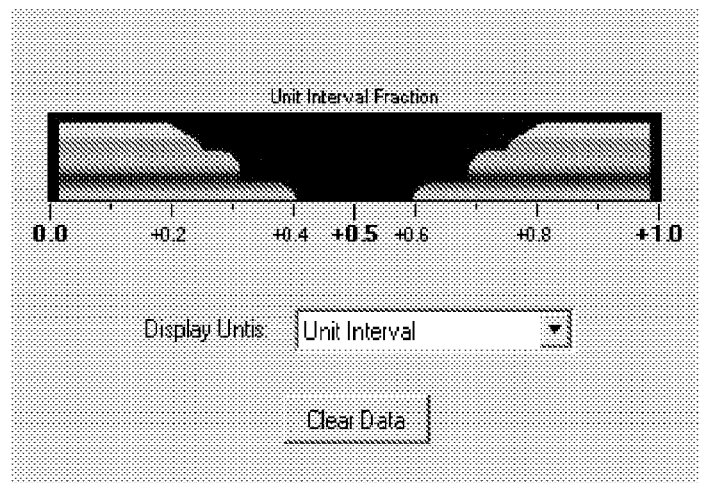
FIG. 14 is a graphical depiction illustrating the performance curve generated by the system and method for depicting the performance of a serial communications link using horizontally layered color coding.

FIG. 14 is a graphical depiction illustrating the performance curve generated by the system and method for depicting the performance of a serial communications link using horizontally layered color coding.

Figure 15:
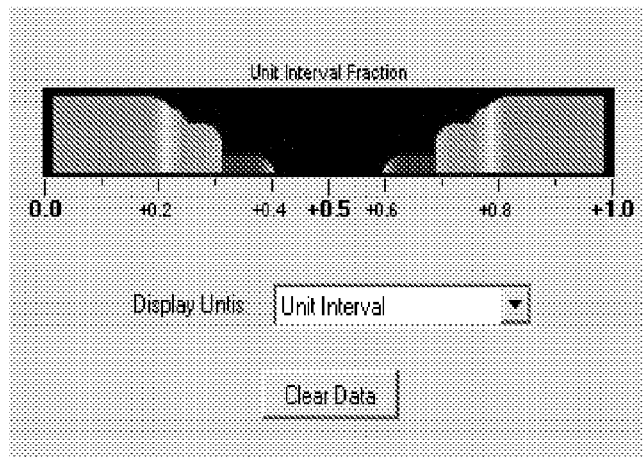
FIG. 15 is a graphical depiction illustrating the performance curve generated by the system and method for depicting the performance of a serial communications link using vertically striped color coding keyed to the BER value at each position on the x axis.

FIG. 15 is a graphical depiction illustrating the performance curve generated by the system and method for depicting the performance of a serial communications link using vertically striped color coding keyed to the BER value at each position on the x axis.

Figure 16:
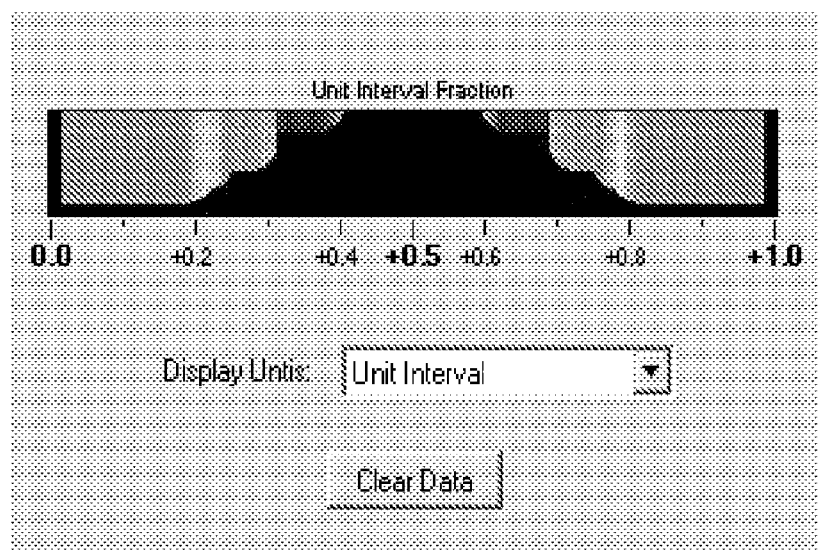
FIG. 16 is a graphical depiction illustrating the performance curve generated by the system and method for depicting the performance of a serial communications link using an inverted representation of the color coding keyed to the BER on the x axis shown in FIG. 15.

FIG. 16 is a graphical depiction illustrating the performance curve generated by the system and method for depicting the performance of a serial communications link using an inverted representation of the color coding keyed to the BER on the x axis shown in FIG. 15.

Figure 17:
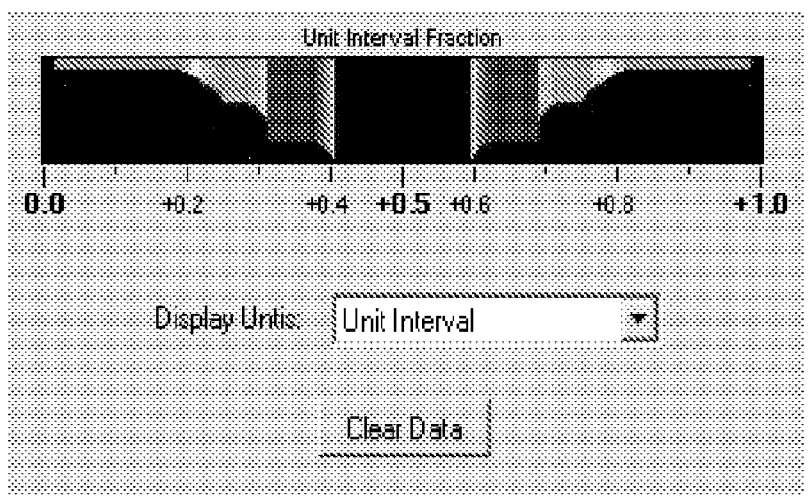
FIG. 17 is a graphical depiction illustrating the performance curve generated by the system and method for depicting the performance of a serial communications link using the top of the graph as the baseline.

FIG. 17 is a graphical depiction illustrating the performance curve generated by the system and method for depicting the performance of a serial communications link using the top of the graph as the baseline.

Figure 18:
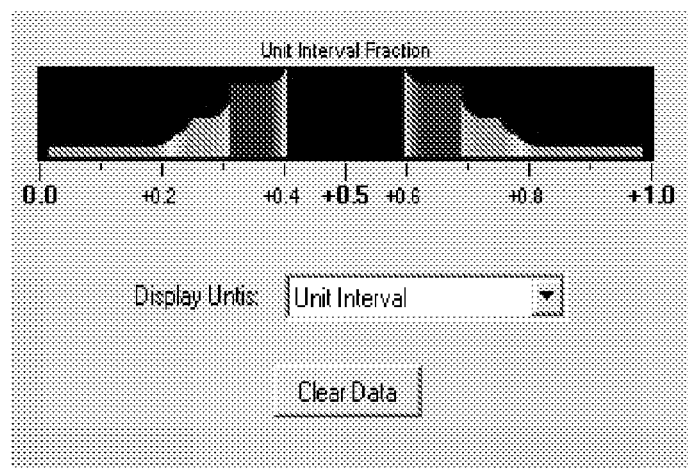
FIG. 18 is a graphical depiction illustrating the performance curve generated by the system and method for depicting the performance of a serial communications link using the bottom of the graph as the baseline and the height of the curve related to the number of correct bits transmitted.

FIG. 18 is a graphical depiction illustrating the performance curve generated by the system and method for depicting the performance of a serial communications link using the bottom of the graph as the baseline and the height of the curve related to the number of correct bits transmitted as a fraction of the total number of bits transmitted (a "Bits Correct Ratio") rather than the BER.

Figure 19:
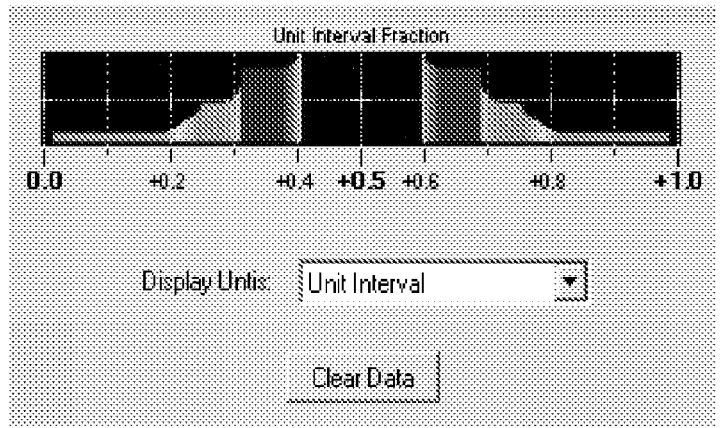
FIG. 19 is a graphical depiction illustrating the performance curve generated by the system and method for depicting the performance of a serial communications link as shown in FIG. 18 with the addition of graticules.

FIG. 19 is a graphical depiction illustrating the performance curve generated by the system and method for depicting the performance of a serial communications link as shown in FIG. 18 with the addition of graticules.

The foregoing detailed description has been given for understanding exemplary implementations of the invention and no unnecessary limitations should be understood therefrom as modifications will be obvious to those skilled in the art without departing from the scope of the appended claims and their equivalents.

What is claimed is:

1. A system for measuring performance of a serial communications link between a transmitter and a receiver in a system under test, at least one of the transmitter and the receiver having at least one tunable parameter, the system comprising:
at least one controller coupled to at least one of transmitter and the receiver in the system under test via a joint test action group (JTAG) interface; and
logic configured to perform a bit error ratio test (BERT) at each phase location of a plurality of receiver phase locations over at least a defined time period, to determine whether a BERT error count is greater than zero at each phase location, to conclude the BERT for each phase location when the corresponding BERT error count is determined to be greater than zero, and to continue the BERT for each phase location when the corresponding BERT error count is determined to be zero.

2. The system of claim 1, further comprising:
logic configured to determine a magnitude corresponding to a bit error ratio when the BERT error count is determined to be greater than zero.

3. The system of claim 2, in which the magnitude corresponding to the bit error ratio is converted to a color.

4. The system of claim 3, in which the magnitude corresponding to the bit error ratio is converted to a Y location on a Cartesian coordinate display.

5. The system of claim 4, in which the color is indicated as a line of the Cartesian coordinate display for each receiver phase location.

6. The system of claim 1, further comprising:
logic configured to assign a color to each phase location having a corresponding BERT error count determined to be zero.

7. The system of claim 6, in which the color is indicated as a line of the Cartesian coordinate display for each phase location.

8. The system of claim 1, further comprising:
logic configured to determine whether a maximum dwell time has been reached for performing the BERT at each phase location, to conclude the BERT for a phase location when it is determined that the maximum dwell time has been reached for the phase location, and to continue the BERT for a phase location when it is determined that the maximum dwell time has not been reached for the phase location.

9. A system for depicting performance of a communications link, comprising:
logic configured to be executed by a processor to perform a bit error ratio test (BERT) at each phase location of a plurality of phase locations to determine whether a BERT error count for each phase location is equal to zero; and
logic configured to determine the bit error ratio corresponding to each phase location having a BERT error count not equal to zero; to convert the bit error ratio at each of the determined phase locations to a Y coordinate; to assign a color to the bit error ratio at each of the determined phase locations; and to draw a line segment having the color from an X axis location that corresponds to each of the determined phase locations to the corresponding Y coordinate location to produce a graph having adjacent line segments visually indicating variations in the bit error ratios corresponding to the determined phase locations.

10. The system of claim 9, further comprising:
logic configured to determine a series of locations on the X axis corresponding to phase locations having BERT error counts that are zero; and to draw a shaded rectangle in a selected color, the shaded rectangle having a width corresponding to the series of locations and a height corresponding to a data drawing area, the selected color being different from the color of the line segments corresponding to the determined phase locations having BERT error counts not equal to zero.

11. The system of claim 10, in which a width of the shaded rectangle corresponds to a clear eye channel of a data communications link.

12. The system of claim 11, in which the color is indicative of the clear eye channel of the data communications link.

13. The system of claim 9, in which the color is indicative of the BER at the particular X axis location that corresponds to the particular phase location.

14. A method for measuring performance of a serial communications link coupling a transmitter and a receiver in a system under test, at least one of the transmitter and the receiver having at least one tunable parameter, the method comprising:
providing at least one controller coupled to at least one of the transmitter and the receiver via a joint test action group (JTAG) interface;
performing a bit error ratio test (BERT) at each phase location of a plurality of receiver phase locations over at least a defined time period;

determining whether a BERT error count is greater than zero at each phase location;

concluding the BERT for a phase location when the corresponding BERT error count is determined to be greater than zero; and continuing the BERT for a phase location when the corresponding BERT error count is determined to be zero.

15. The method of claim 14, further comprising:

determining a magnitude corresponding to the bit error ratio when the corresponding BERT error count is determined to be greater than zero.

16. The method of claim 15, further comprising:

converting the magnitude corresponding to the bit error ratio to a color.

17. The method of claim 16, further comprising:

converting the magnitude corresponding to the bit error ratio to a Y location on a Cartesian coordinate display.

18. The method of claim 17, further comprising:

indicating the color as a line of the Cartesian coordinate display for each receiver phase location.

19. The method of claim 14, further comprising:

assigning a color to each phase location when the BERT indicates a BERT error count of zero.

20. The method of claim 14, further comprising:

determining whether a maximum dwell time has been reached for performing the BERT at each phase location;

concluding the BERT for a phase location when it is determined that the maximum dwell time has been reached; and continuing the BERT for a phase location when it is determined that the maximum dwell time has not been reached.

* * * * *

UNITED STATES PATENT AND TRADEMARK OFFICE
CERTIFICATE OF CORRECTION

PATENT NO. : 7,870,445 B2
APPLICATION NO. : 11/962607
DATED : January 11, 2011
INVENTOR(S) : Robert Saponas et al.

Page 1 of 1

It is certified that error appears in the above-identified patent and that said Letters Patent is hereby corrected as shown below:

In column 13, line 47, in Claim 1, before "transmitter" insert -- the --.

In column 14, line 2, in Claim 5, after "each" delete "receiver".

In column 14, line 35, in Claim 13, delete "BER" and insert -- BERT --, therefor.

In column 16, line 3, in Claim 18, after "each" delete "receiver".

Signed and Sealed this
Fifth Day of April, 2011

David J. Kappos
*Director of the United States Patent and Trademark Office*